US008097118B2

(12) United States Patent
Tominaga

(10) Patent No.: US 8,097,118 B2
(45) Date of Patent: Jan. 17, 2012

(54) METHOD FOR MANUFACTURING LIQUID EJECTION HEAD

(75) Inventor: Yasuaki Tominaga, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 233 days.

(21) Appl. No.: 12/638,849

(22) Filed: Dec. 15, 2009

(65) Prior Publication Data

US 2010/0154985 A1 Jun. 24, 2010

(30) Foreign Application Priority Data

Dec. 19, 2008 (JP) ................................ 2008-323678

(51) Int. Cl.

| | |
|---|---|
| ***B29C 65/70*** | (2006.01) |
| ***B32B 27/04*** | (2006.01) |
| ***B32B 27/16*** | (2006.01) |
| ***B32B 27/26*** | (2006.01) |
| ***B32B 37/24*** | (2006.01) |
| ***B32B 38/10*** | (2006.01) |
| ***C08J 5/02*** | (2006.01) |
| ***G03F 1/06*** | (2006.01) |
| ***G03F 7/34*** | (2006.01) |
| ***G03F 7/40*** | (2006.01) |
| ***G03F 7/16*** | (2006.01) |
| *G03F 7/42* | (2006.01) |
| *B23P 17/04* | (2006.01) |
| *B32B 37/02* | (2006.01) |
| *B29C 65/12* | (2006.01) |

(52) U.S. Cl. .................... 156/306.9; 430/320; 29/890.1; 156/242; 156/245; 156/249; 156/307.1; 156/703; 156/711; 156/719

(58) Field of Classification Search .................. 430/320; 29/890.1; 156/242, 245, 249, 289, 703, 711, 156/719, 306.9, 307.1
See application file for complete search history.

(56) References Cited

U.S. PATENT DOCUMENTS

| | | | | |
|---|---|---|---|---|
| 5,376,204 | A * | 12/1994 | Amano | 156/234 |
| 5,760,803 | A * | 6/1998 | Yamamoto et al. | 347/47 |
| 6,982,022 | B2 * | 1/2006 | Clark et al. | 156/230 |
| 7,138,064 | B2 | 11/2006 | Honda | |
| 2009/0229125 | A1 * | 9/2009 | Kato et al. | 29/890.1 |

FOREIGN PATENT DOCUMENTS

| | | | |
|---|---|---|---|
| JP | 08156254 | A * | 6/1996 |
| JP | 11-335464 | A | 12/1999 |
| JP | 2007-176076 | A1 | 7/2007 |

* cited by examiner

*Primary Examiner* — Sonya Mazumdar
(74) *Attorney, Agent, or Firm* — Canon U.S.A., Inc., IP Division

(57) ABSTRACT

A method for manufacturing a liquid ejection head having an ejection port-forming member in which an ejection port configured to eject liquid is formed, includes the steps of preparing a substrate including a base substrate; a first layer composed of a resin composition not containing a polymerization initiator but containing a compound that can be polymerized by irradiation with active energy rays under the presence of the polymerization initiator; and a second layer composed of an active energy ray-curable resin composition containing the polymerization initiator; pressing a mold, on which a pattern of the ejection port has been formed, against the first layer and the second layer; irradiating the second layer with the active energy rays while the mold is being pressed against the first layer and the second layer; bonding the second layer to another supporting substrate; and detaching the base substrate.

9 Claims, 5 Drawing Sheets

METHOD FOR MANUFACTURING LIQUID EJECTION HEAD

BACKGROUND OF THE INVENTION

1. Field of the Invention

The present invention relates to a method for forming a structural body and a method for manufacturing an ink jet head.

2. Description of the Related Art

In recent years, an improvement in printing performance, particularly high resolution and high speed printing, has been required for ink jet recording apparatuses. To this end, high image quality needs to be achieved by shrinking the size of droplets of ejected ink, increasing the density of a nozzle array, and increasing the number of pixels per unit area. To achieve this, there is required a method for manufacturing a liquid ejection head in which a large number of micropores (ejection ports) are formed with high density and high definition. Thus, various methods have been proposed. In particular, a method for manufacturing a liquid ejection head by a press molding method (imprinting method) using a mold has received attention because multiple materials can be molded at the same time and molding can be performed with high precision at low cost.

A method for manufacturing a porous plate described below has been proposed as a method for manufacturing an ink jet recording head using a technology such as an imprinting method or a technology similar to the imprinting method. For example, Japanese Patent Laid-Open No. 2007-176076 discloses a method for manufacturing a porous plate, including the steps of heating a two-layer member configured by stacking a first material and a second material; performing press molding using a mold with a protrusion corresponding to a nozzle while the two-layer member is being heated, such that the protrusion corresponding to a nozzle penetrates the second material and part of the first material; and removing the mold from the two-layer member and detaching the first material from the second material.

For example, U.S. Pat. No. 7,138,064 discloses a method for manufacturing a multilayer wiring board described below as a method in which a structural body formed on a substrate is detached from the substrate without causing damage. The method includes the steps of forming an etch-back layer on a supporting substrate; forming a multilayer wiring board on the etch-back layer; removing the etch-back layer by etching under the conditions that the supporting substrate and the multilayer wiring board are not etched; and detaching the multilayer wiring board from the supporting substrate. Furthermore, Japanese Patent Laid-Open No. 2007-283657 discloses a method for manufacturing a through-hole structural body described below. In a multilayer workpiece configured by stacking structural body layers each composed of the same material, the method includes the steps of disposing a separating layer between the structural body layers; stamping at least one of the structural body layers of the workpiece by press working; and detaching the structural body layers of the workpiece.

However, in the manufacturing method disclosed in Japanese Patent Laid-Open No. 2007-176076, a porous plate composed of a single material is manufactured from two materials prepared on a substrate. Thus, there are problems in that the amount of materials used is increased and the number of manufacturing steps is increased.

In the method for manufacturing a multilayer wiring board disclosed in U.S. Pat. No. 7,138,064, since there are required a step of forming an etch-back layer and a step of removing the etch-back layer by etching, it is expected that the manufacturing steps become complicated. Furthermore, since there are required the etch-back layer and the etching conditions configured such that the supporting substrate and the multilayer wiring board are not etched, the design flexibility is limited.

In the method for manufacturing a through-hole structural body disclosed in Japanese Patent Laid-Open No. 2007-283657, since the multilayer workpiece is formed and pressed, a material such as liquid that cannot form a multilayer structure cannot be used as a material of a structural body.

SUMMARY OF THE INVENTION

In view of the foregoing problems, the present invention provides a method for manufacturing a liquid ejection head that can be manufactured through simple manufacturing steps with a small number of materials used.

An example of the present invention is a method for manufacturing a liquid ejection head having an ejection port-forming member in which an ejection port configured to eject liquid is formed, including the steps of (a) preparing a substrate including a base substrate; a first layer composed of a resin composition containing a compound that can be polymerized by irradiation with active energy rays under the presence of a polymerization initiator and without a polymerization initiator, the first layer being formed on the base substrate; and a second layer composed of an active energy ray-curable resin composition containing the polymerization initiator, the second layer being formed on the first layer; (b) pressing a mold, on which at least a pattern of the ejection port has been formed, against the first layer and the second layer; (c) irradiating the second layer with the active energy rays through the mold or the base substrate using a mechanism that selectively blocks the active energy rays applied to a portion corresponding to the ejection port, the portion being disposed on the mold or the base substrate, while the mold is being pressed against the first layer and the second layer; (d) performing post-exposure baking to cure the second layer irradiated with the active energy rays and to form a cured portion in the first layer at a part into which reaction sites of a polymerization reaction in the second layer have diffused, the rest of the first layer being left as an uncured portion; (e) removing the mold; (f) bonding the second layer to another supporting substrate; and (g) detaching the base substrate by dissolving the uncured portion of the first layer.

In the method for manufacturing a liquid ejection head according to the present invention, since a liquid ejection head composed of materials of the same number as that of materials prepared on a base substrate can be manufactured, the number of materials used can be reduced and the manufacturing steps can be simplified.

Further features of the present invention will become apparent from the following description of exemplary embodiments with reference to the attached drawings.

DESCRIPTION OF THE EMBODIMENTS

Figure 1:
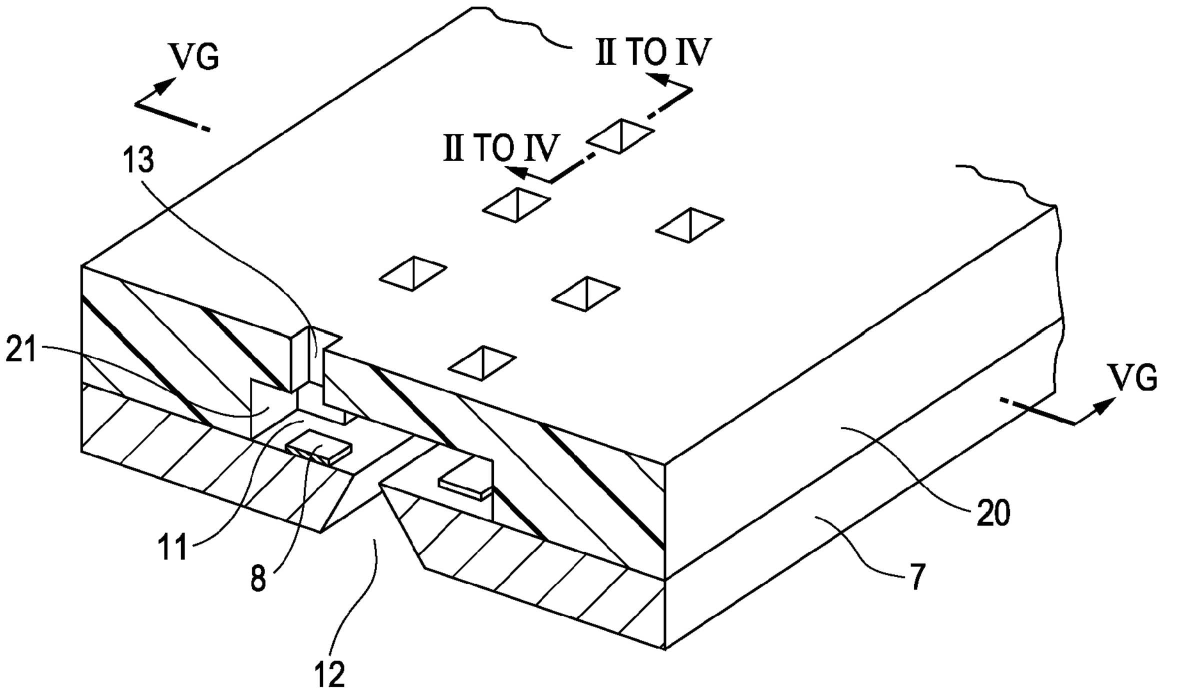
FIG. 1 is a schematic perspective view of a liquid ejection head according to the present invention.

FIG. 1 shows a liquid ejection head manufactured by a manufacturing method according to the present invention.

In FIG. 1, a supply port 12 configured to supply liquid to flow passages 11 is formed on a supporting substrate 7 including energy generating elements 8. Furthermore, an ejection port-forming member 20 that includes ejection ports 13 and walls 21 defining the flow passages 11 communicating with the ejection ports 13 is disposed on the supporting substrate 7 including the energy generating elements 8 configured to generate energy used for ejecting liquid.

In the above-described structure, liquid is supplied from the supply port 12 to the flow passages 11 and held. The held liquid is ejected using energy that is supplied from the energy generating elements 8 in accordance with a recording signal. When the energy generating elements are composed of an electric thermal conversion member, an air bubble is instantaneously produced in the liquid. With the pressure change caused by the growth of the air bubble, droplets are ejected from the ejection ports 13 to record an image on a recording medium.

Embodiments of a method for manufacturing a liquid ejection head according to the present invention will be described, but the present invention is not limited to these embodiments.

First Embodiment

FIGS. 2A to 2G are flow diagrams showing, in manufacturing order, the steps of a method for manufacturing a liquid ejection head in a first embodiment. FIGS. 2A to 2G are sectional views taken along line II-II of the liquid ejection head shown in FIG. 1 and each shows part of a section in each of the steps.

Figure 2A:
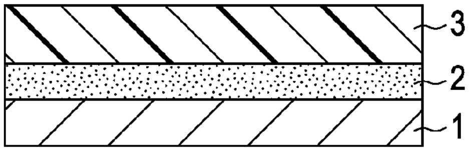
FIGS. 2A to 2G are schematic sectional views for describing an embodiment of a method for manufacturing a liquid ejection head of the present invention.

As shown in FIG. 2A, there is prepared a substrate in which a first layer 2 is formed on a base substrate 1 and a second layer 3 is formed on the first layer 2. The first layer 2 is composed of a resin composition substantially not containing a polymerization initiator but containing a compound that can be polymerized through the irradiation with active energy rays under the presence of the polymerization initiator. The second layer 3 is composed of an active energy ray-curable resin composition containing the polymerization initiator.

The base substrate 1 may be composed of a material such as silicon, glass, a resin film (e.g., polyethylene terephthalate (PET)), or the like. The material can be suitably selected and used as long as the material can endure a step of pressing a mold 4 against the first layer 2 and the second layer 3 (hereinafter also referred to as an imprinting step) and a post-exposure baking step.

Examples of the compound that is used for the first layer 2 and can be polymerized through the irradiation with active energy rays under the presence of a polymerization initiator include a resin compound that is used for a negative resist and polymerized under the presence of a radical polymerization initiator and a resin compound that is used for a negative resist and polymerized under the presence of a cationic polymerization initiator. However, the compound is not limited to these resin compounds as long as the compound does not polymerize through the irradiation with active energy rays when a polymerization initiator is not present and polymerizes when a polymerization initiator is present.

The resin compound that is used for a negative resist and polymerized under the presence of a radical polymerization initiator is cured through the polymerization and cross-linking between molecules such as monomers and prepolymers that are contained in the resin compound and can be radically polymerized. Examples of the radically-polymerizable monomers and prepolymers include monomers and prepolymers having an acryloyl group, a methacryloyl group, an acrylamide group, maleic acid diester, or an allyl group, but the radically-polymerizable monomers and prepolymers are not limited to these monomers and prepolymers.

The resin compound that is used for a negative resist and polymerized under the presence of a cationic polymerization initiator is cured through the polymerization and cross-linking between molecules such as monomers and prepolymers that are contained in the resin compound and can be cationically polymerized. Examples of the cationically polymerizable monomers and prepolymers include monomers and prepolymers having an epoxy group, a vinyl ether group, or an oxetane group, but the cationically-polymerizable monomers and prepolymers are not limited to these monomers and prepolymers.

As described below, when active energy rays are applied through the base substrate 1, the first layer 2 is composed of a resin composition that transmits the active energy rays. The resin composition that transmits the active energy rays is composed of any material that transmits at least part of the active energy rays required for curing the active energy ray-curable resin composition of the second layer 3.

Furthermore, a resin formed by curing the compound that is contained in the first layer 2 and can be polymerized desirably has repellency. With the compound that forms a resin having repellency after curing, liquid can be prevented from being left at an ejection port during the ejection of the liquid, and a liquid ejection head that can eject liquid in a better manner can be manufactured.

Examples of the compound that forms a resin having repellency after curing include fluoroalkylalkoxysilanes, fluoroalkyl-containing epoxy resins, silicone-acrylic block copolymers, and a mixture of a copolymer of phenols containing an allyl group and organohydrosiloxane with an amino condensate modified with formalin or formalin alcohol, the mixture being disclosed in Japanese Patent Laid-Open No. 11-335464. The resin having repellency is not limited to these materials.

These compounds that are used for the first layer 2 and can be polymerized through the irradiation with active energy rays under the presence of a polymerization initiator may be used alone or in combination. Furthermore, additives or the like can be optionally added suitably.

Examples of the active energy ray-curable resin composition that is used for the second layer 3 formed on the first layer 2 and contains the polymerization initiator include a negative resist that uses a radical polymerization reaction and a negative resist that uses a cationic polymerization reaction. However, the active energy ray-curable resin composition is not limited to these resists as long as it contains a polymerization initiator that can polymerize the compound contained in the first layer 2.

The negative resist that uses a radical polymerization reaction is cured through polymerization and cross-linking between molecules such as monomers and prepolymers that are contained in the resist and can be radically polymerized, using radicals generated from a photo-radical polymerization initiator contained in the resist. Examples of the photo-radical polymerization initiator include benzoin, benzophenone, thioxanthone, anthraquinone, acylphosphine oxide, titanocene, and acridine. Examples of the radically-polymerizable monomers and prepolymers include monomers and prepolymers having an acryloyl group, a methacryloyl group, an acrylamide group, maleic acid diester, or an allyl group, but the radically-polymerizable monomers and prepolymers are not limited to these monomers and prepolymers.

The negative resist that uses a cationic polymerization reaction is cured through polymerization and cross-linking between molecules such as monomers and prepolymers that are contained in the resist and can be cationically polymerized, using cations generated from a photo-cationic polymerization initiator contained in the resist. Examples of the photo-cationic polymerization initiator include aromatic iodonium salts and aromatic sulfonium salts. Examples of the cationically-polymerizable monomers and prepolymers include monomers and prepolymers having an epoxy group, a vinyl ether group, or an oxetane group, but the cationically-polymerizable monomers and prepolymers are not limited to these monomers and prepolymers.

The active energy ray-curable resin compositions containing such polymerization initiators may be used alone or in combination. Furthermore, additives or the like can be optionally added suitably.

Commercially available "SU-8 series" and "KMPR-1000" (trade name) available from Kayaku MicroChem Corporation and "TMMR 52000" and "TMMF 52000" (trade name) available from TOKYO OHKA KOGYO CO., LTD can also be used as the negative photoresist.

A layer composed of a material that transmits active energy rays may be formed on the second layer 3. The material that transmits the active energy rays is any material that transmits at least part of the active energy rays required for curing the active energy ray-curable resin composition used for the second layer 3.

A method for forming the first layer 2 and the second layer 3 on the base substrate 1 is not particularly limited. A suitable method such as spin coating, laminating, or spray coating can be used in accordance with a resin used. When the second layer 3 is formed on the first layer 2, for example, a solvent contained in the first layer 2 needs to be volatized by heating in advance to prevent the resin compositions of the first and second layers from being mixed due to the dissolution of the first layer 2.

The first layer 2 can have a thickness of 0.5 to 5 μm, though the thickness depends on the kind of resin compositions used. The second layer 3 can have a thickness of 5 to 100 μm, though the thickness depends on the kind of resin compositions used.

Figure 2B:
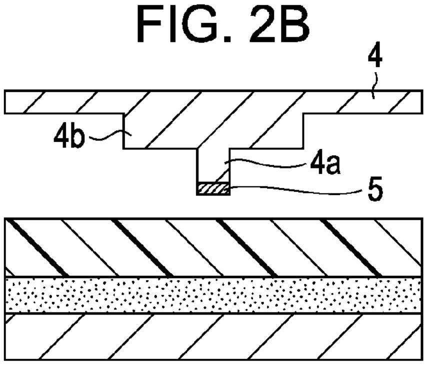

As shown in FIG. 2B, a mold 4 composed of a material that transmits active energy rays is then prepared. Examples of the material of the mold 4 include glass, quartz, and resins. The material of the mold 4 is not limited to these, and other materials that transmit active energy rays may be used.

A projecting portion 4*a* corresponding to an ejection port, a projecting portion 4*b* corresponding to a flow passage, and a light-blocking film 5 corresponding to an ejection port, the light-blocking film 5 being used as a mechanism that selectively blocks active energy rays, are formed on the mold 4. Since the mold 4 includes the projecting portion 4*a* corresponding to an ejection port and the projecting portion 4*b* corresponding to a flow passage, an ejection port and a flow passage can be formed at the same time.

A metal film can be used as the light-blocking film 5 corresponding to an ejection port. Examples of the metal film include a Cr film and an Al film. The material and thickness of the light-blocking film 5 can be suitably selected as long as the light-blocking film 5 has an ability to block the active energy rays used.

The mold 4 can be processed by photolithography, etching, and film formation used in a typical semiconductor process.

The mold 4 can be manufactured as follows. For example, first, a metal film is formed on a mold surface by sputtering. A resist is then applied, and pattern exposure and development are performed using a mask having a pattern of an ejection port. Subsequently, the metal film is etched and the resist is removed to form a light-blocking film 5 corresponding to an ejection port.

A resist is applied again to the mold on which the light-blocking film 5 corresponding to an ejection port has been formed. Pattern exposure and development are performed using a mask having a pattern of a flow passage. A projecting portion 4*b* corresponding to a flow passage is formed by performing etching using the patterned resist as a mask and by removing the resist.

Subsequently, a projecting portion 4*a* corresponding to an ejection port is formed by performing etching using the light-blocking film 5 corresponding to an ejection port as a mask. This can provide a mold 4 that is shown in FIG. 2B and includes the projecting portion 4*a* corresponding to an ejection port, the projecting portion 4*b* corresponding to a flow passage, and the light-blocking film 5 corresponding to an ejection port.

The lengths of the projecting portion 4*a* corresponding to an ejection port and the projecting portion 4*b* corresponding to a flow passage in a depth direction can be suitably adjusted in accordance with the thicknesses of the first layer 2 and the second layer 3. In consideration of precision of an ejection port, however, the lengths can be adjusted such that the tip of the projecting portion 4*a* corresponding to an ejection port reaches the first layer 2 when the mold 4 is pressed against the first layer 2 and the second layer 3 as described below.

Figure 2C:
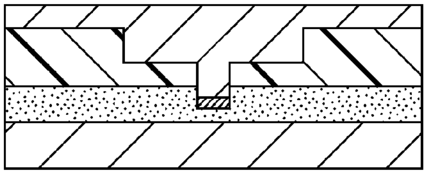

As shown in FIG. 2B, the base substrate 1 is opposed to the mold 4 such that the second layer 3 formed on the base substrate 1 faces the projecting portion 4*a* of the mold 4. The mold 4 is then pressed against the first layer 2 and the second layer 3 while the mold 4 and the base substrate 1 are in parallel (FIG. 2C).

The first layer 2 and the second layer 3 flow in accordance with the projection and depression pattern formed on the mold 4. As a result, the projection and depression pattern of the mold 4 is transferred to the first layer 2 and the second layer 3.

The pressure applied when the mold 4 is pressed against the first layer 2 and the second layer 3 is desirably 0.01 to 10 MPa, though the pressure depends on the kind of resin compositions constituting the first layer 2 and the second layer 3. In this embodiment, the tip of the projecting portion 4*a* corresponding to an ejection port reaches the first layer 2 in consideration of precision of an ejection port.

The base substrate 1, the first layer 2, and the second layer 3 may be heated in advance. This decreases the viscosity of the resin compositions of the first layer 2 and the second layer 3 and allows the resin compositions of the first layer 2 and second layer 3 to easily flow in accordance with the projection and depression pattern of the mold 4. Thus, high pattern reproducibility can be expected. In addition, the pressure during imprinting can be expected to be reduced. The heating temperature is desirably 50 to 200° C., though the temperature depends on the kind of the resin compositions of the first layer 2 and the second layer 3. When the active energy ray-curable resin composition of the second layer 3 is liquid, the resin composition has high flowability. Therefore, a transfer pattern highly close to the mold pattern can be obtained by performing imprinting at a low pressure of about several atmospheres.

Figure 2D:
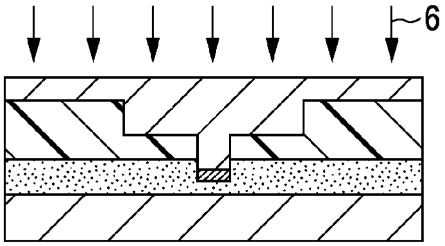

Next, the second layer 3 is irradiated with active energy rays 6 through the mold 4 while the mold 4 is being pressed against the first layer 2 and the second layer 3 (FIG. 2D). The kind of the active energy rays 6 is not particularly limited as long as the active energy ray-curable resin composition of the second layer 3 is cured. Examples of the active energy rays 6 include ultraviolet rays, visible light, infrared rays, X rays, and gamma rays. Among them, ultraviolet rays are desirably used. The dose of the active energy rays is not particularly limited as long as the active energy ray-curable resin composition of the second layer 3 is cured.

In this embodiment, since the mold 4 is composed of a material that transmits the active energy rays 6, the active energy rays 6 applied from the mold 4 side reach the second layer 3 through the mold 4. However, since the light-blocking film 5 corresponding to an ejection port is composed of a material that does not transmit the active energy rays 6, the active energy rays 6 are not applied, due to the light-blocking film 5 corresponding to an ejection port, to the active energy ray-curable resin composition of the second layer 3 that is pressed using the mold 4 and is present at the tip of the projecting portion 4*a* corresponding to an ejection port.

In the second layer 3 irradiated with the active energy rays 6, reaction sites of a polymerization reaction are produced by absorbing the energy of the active energy rays 6 and the polymerization reaction proceeds. Thus, the second layer 3 becomes insoluble in a developing solution. On the other hand, in the second layer 3 not irradiated with the active energy rays 6 by blocking the active energy rays 6 with the light-blocking film 5 corresponding to an ejection port, the energy of the active energy rays 6 is not absorbed and a polymerization reaction is not caused. Thus, the second layer 3 remains soluble in a developing solution.

Subsequently, by heating at least one of the base substrate 1 and the mold 4, the first layer 2 and the second layer 3 are heated. The heating facilitates the curing of the second layer 3 irradiated with the active energy rays 6. Furthermore, the reaction sites of a polymerization reaction contained in the second layer 3 diffuse to the first layer 2, whereby a cured portion 2*a* of the first layer is formed in the first layer at a part into which the reaction sites of a polymerization reaction have diffused and an uncured first layer 2 is left in a remaining portion of the first layer into which the reaction sites of a polymerization reaction have not diffused. The reaction sites of a polymerization reaction are not limited to the polymerization initiator contained in the second layer 3, and include a reaction species produced from the polymerization initiator through the irradiation with the active energy rays 6. The heating temperature is desirably 50 to 200° C., though it depends on the kind of resin compositions of the first layer 2 and the second layer 3 used, the kind of the polymerization initiator, and the amount of the polymerization initiator.

Figure 2E:
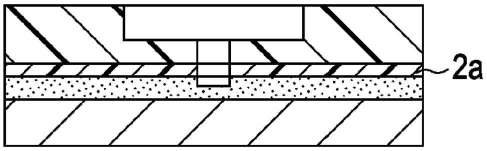

As shown in FIG. 2E, the mold 4 is removed from the first layer 2 and the second layer 3. The mold 4 can be removed by, for example, detachment, dissolution, or melting, but detachment is desirable because the mold 4 can be used multiple times. To prevent part of the first layer 2 and the second layer 3 from being attached to the mold 4 during detachment, mold release treatment such as the application of a release agent may be performed on the surfaces of the projecting portion 4*a* corresponding to an ejection port and the projecting portion 4*b* corresponding to a flow passage.

A supporting substrate 7 including an energy generating element 8 is prepared. Although not shown in FIGS. 2F and 2G, the supporting substrate 7 includes a supply port that is an opening configured to supply liquid and electrical junctions such as wiring lines configured to drive the energy generating element 8.

Figure 2F:
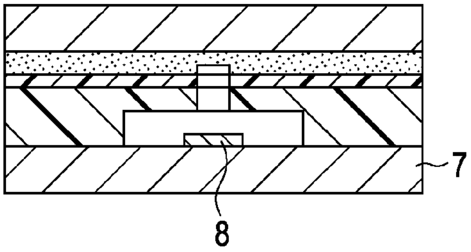

Subsequently, as shown in FIG. 2F, the second layer 3 having a pattern is bonded to the supporting substrate 7. A step of bonding the second layer 3 to the supporting substrate 7 is not particularly limited, but the second layer 3 and the supporting substrate 7 are bonded to each other after they are aligned with each other such that the formed pattern of an ejection port corresponds to the energy generating element 8 formed on the supporting substrate 7. The pressure applied to the supporting substrate 7 during the bonding is about 0.01 to 10 MPa. If necessary, they may be bonded to each other in vacuum while being heated.

The uncured portions of the first layer and the second layer are then dissolved, and the base substrate 1 is detached from the cured portion 2*a* of the first layer. The uncured portions of the first layer 2 and the second layer 3 are dissolved by eluting the uncured portions using a solvent that dissolves only the uncured portions. If necessary, ultrasonic irradiation or the like may be used together. The method for dissolving the uncured portions is not limited to these methods, and other methods may be used.

Figure 2G:
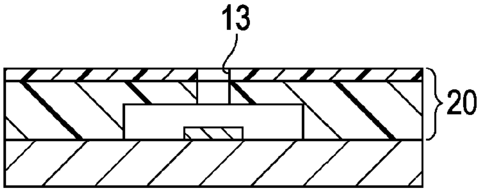

Thus, there can be provided a liquid ejection head including an ejection port-forming member 20 in which at least an ejection port configured to eject liquid is formed (FIG. 2G).

Second Embodiment

FIGS. 3A to 3G are flow diagrams showing, in manufacturing order, the steps of a method for manufacturing a liquid ejection head in a second embodiment. FIGS. 3A to 3G are sectional views taken along line III-III of the liquid ejection head shown in FIG. 1 and each shows a section in each of the steps.

Figure 3A:
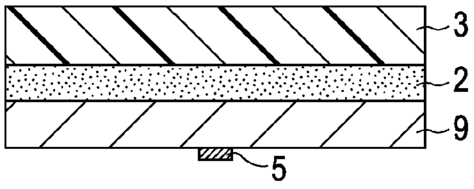
FIGS. 3A to 3G are schematic sectional views for describing an embodiment of a method for manufacturing a liquid ejection head of the present invention.

As shown in FIG. 3A, there is prepared a substrate in which a first layer 2 and a second layer 3 are formed on a base substrate 9 as in the first embodiment. The same resin compositions as in the first embodiment can be used as resin compositions of the first layer 2 and the second layer 3, but the first layer 2 is composed of a resin composition that transmits active energy rays.

The base substrate 9 is composed of a material such as glass, quartz, or a resin that transmits the active energy rays. The material of the base substrate 9 is not limited to these materials, and other materials that transmit active energy rays may be used.

In the base substrate 9, a light-blocking film 5 is formed on a portion corresponding to an ejection port as a mechanism that selectively blocks active energy rays. In FIG. 3A, the light-blocking film 5 is illustrated on a surface opposite the surface under which the first layer 2 and the second layer 3 are formed. However, the position of the light-blocking film 5 is not limited, and the light-blocking film 5 may be disposed in any position that corresponds to an ejection port. As in the first embodiment, the material, thickness, and formation method of the light-blocking film 5 can be suitably selected as long as the light-blocking film 5 corresponding to an ejection port has an ability to block the active energy rays used.

Figure 3B:
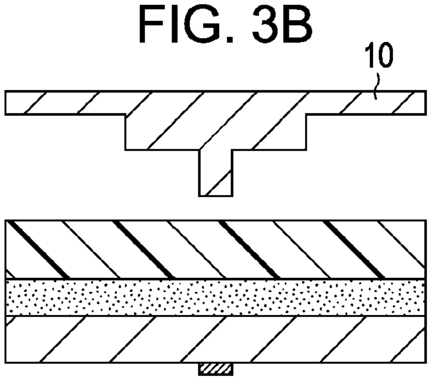

As shown in FIG. 3B, a mold 10 is prepared. The mold 10 is not necessarily composed of a material that transmits active energy rays. The material can be suitably selected and used as long as the material can endure an imprinting step and a post-exposure baking step performed later. The mold 10 can be processed by, for example, photolithography, etching, and film formation used in a typical semiconductor process. Thus, the mold 10 can be easily manufactured.

Figure 3C:
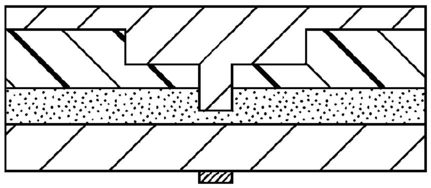

As in the first embodiment, the mold 10 is brought close to the second layer 3 and pressed against the first layer 2 and the second layer 3 (FIG. 3C). Herein, the mold 10 is pressed while the position of a projecting portion of the mold 10 corresponding to an ejection port is aligned with the position of the light-blocking film 5 formed on the base substrate 9.

Figure 3D:
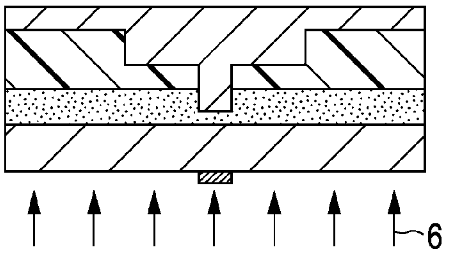

Subsequently, the second layer 3 is irradiated with active energy rays 6 through the base substrate while the mold 10 is being pressed against the first layer 2 and the second layer 3 (FIG. 3D). Consequently, the second layer 3 irradiated with the active energy rays 6 is cured.

As in the first embodiment, by heating at least one of the base substrate 9 and the mold 10, the curing of the second layer 3 irradiated with the active energy rays 6 is facilitated. Furthermore, the reaction sites of a polymerization reaction contained in the second layer 3 diffuse to the first layer 2, whereby a cured portion 2*a* of the first layer is formed in the first layer at a part into which the reaction sites of a polymerization reaction have diffused and an uncured first layer 2 is left in the remaining portion of the first layer into which the reaction sites of a polymerization reaction have not diffused.

Figure 3E:
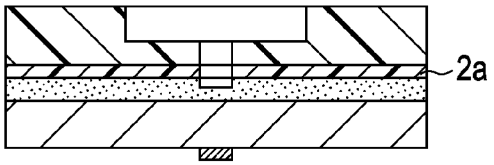

As in the first embodiment, the mold 10 is removed from the first layer 2 and the second layer 3 (FIG. 3E).

Figure 3F:
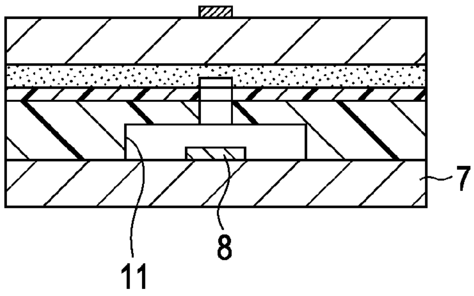

As in the first embodiment, the second layer 3 is bonded to a supporting substrate 7 including an energy generating element 8. A step of bonding the second layer 3 to the supporting substrate 7 is not particularly limited, and the step can be performed as in the first embodiment (FIG. 3F).

As in the first embodiment, the uncured portions of the first layer 2 and the second layer 3 are dissolved and the base substrate 9 is detached from the cured portion 2*a* of the first layer.

Figure 3G:
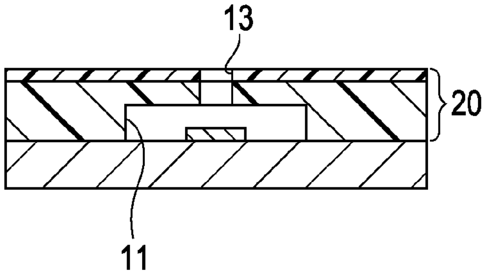

Thus, there can be provided a liquid ejection head in which an ejection port-forming member 20 having an ejection port 13 is disposed on the supporting substrate 7 (FIG. 3G).

Third Embodiment

Figure 4A:
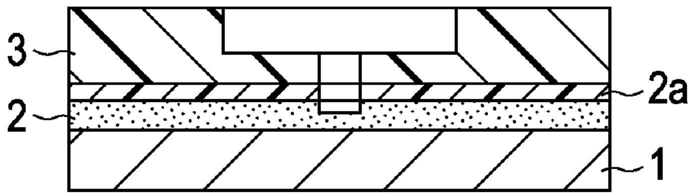
FIGS. 4A to 4C are schematic sectional views for describing an embodiment of a method for manufacturing a liquid ejection head of the present invention.
Figure 4B:
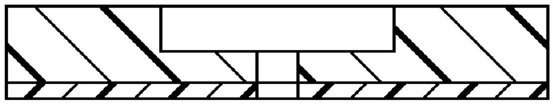
Figure 4C:
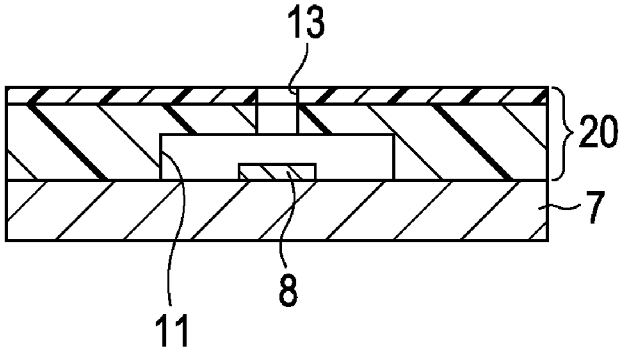

FIGS. 4A to 4C are flow diagrams showing, in manufacturing order, the steps of a method for manufacturing a liquid ejection head in a third embodiment. FIGS. 4A to 4C are sectional views taken along line IV-IV of the liquid ejection head shown in FIG. 1 and each shows a section in each of the steps.

As in the first embodiment, a base substrate 1 on which a first layer 2 and a second layer 3 are stacked is patterned and a mold is removed from the first layer 2 and the second layer 3 (FIG. 4A). In this embodiment, patterning is performed by the method used in the first embodiment, but the patterning may be performed by the method used in the second embodiment.

As in the first embodiment or the second embodiment, the uncured portions of the first layer 2 and the second layer 3 are removed by development, and the base substrate 1 is detached from the cured portion 2*a* of the first layer 2 (FIG. 4B).

As in the first embodiment or the second embodiment, the second layer 3 is bonded to a supporting substrate 7 including an energy generating element 8.

Thus, there can be provided a liquid ejection head including an ejection port-forming member 20 in which at least an ejection port configured to eject liquid is formed (FIG. 4C).

Fourth Embodiment

Figure 5A:
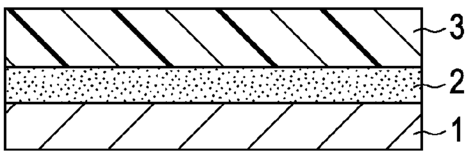
FIGS. 5A to 5G are schematic sectional views for describing an embodiment of a method for manufacturing a liquid ejection head of the present invention.
Figure 5E:
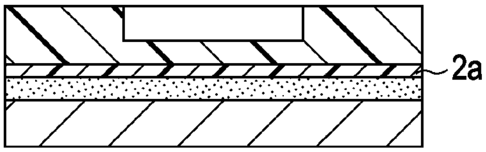
Figure 5B:
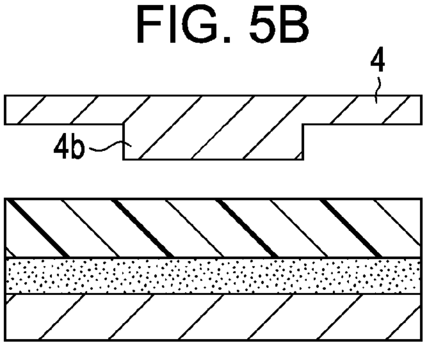
Figure 5F:
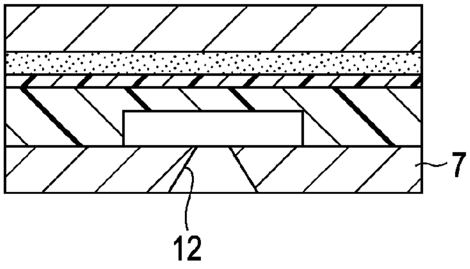
Figure 5C:
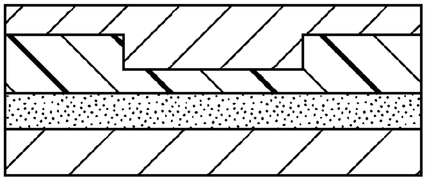
Figure 5G:
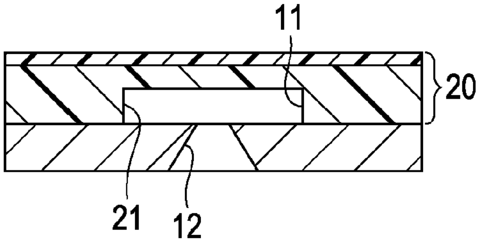

FIGS. 5A to 5G are flow diagrams showing, in manufacturing order, the steps of a method for manufacturing a liquid ejection head in a fourth embodiment. FIG. 5G is a partial sectional view taken along line VG-VG of the liquid ejection head shown in FIG. 1.

As shown in FIG. 5A, there is prepared a substrate in which a first layer 2 and a second layer 3 are formed on a base substrate 1 as in the first embodiment.

A mold 4 is then prepared. A projecting portion 4*b* corresponding to a flow passage is formed on the mold 4. For example, the mold 4 can be processed by photolithography, etching, and film formation used in a typical semiconductor process.

In this embodiment, the mold 4 composed of a material that transmits active energy rays is used, but at least one of the base substrate 1 and the mold 4 needs only to be composed of a material that transmits active energy rays. Furthermore, the material needs to endure an imprinting step and a post-exposure baking step performed later. Examples of the material that transmits active energy rays include glass, quartz, and resins, but the material is not limited to these.

As in the first embodiment, the mold 4 is then brought close to the second layer 3 and pressed against the second layer 3 to form a flow passage pattern at a desired portion (FIG. 5C).

Figure 5D:
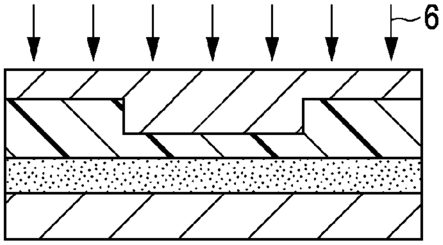

Subsequently, the second layer 3 is irradiated with active energy rays 6 through the mold 4 while the mold 4 is being pressed against the second layer 3 (FIG. 5D). Consequently, the second layer 3 is cured.

As in the first embodiment, by heating at least one of the base substrate 1 and the mold 4, the curing of the second layer 3 is facilitated. Furthermore, reaction sites of a polymerization reaction contained in the second layer 3 diffuse to the first layer 2, whereby a cured portion 2*a* of the first layer is formed in the first layer at a part into which the reaction sites of a polymerization reaction have diffused and an uncured first layer 2 is left in a portion on the base substrate 1 side of the first layer into which the reaction sites of a polymerization reaction have not diffused.

As in the first embodiment, the mold 4 is removed from the second layer 3 (FIG. 5E).

As in the first embodiment, the second layer 3 is bonded to a supporting substrate 7 (FIG. 5F). The supporting substrate 7 includes a supply port that is an opening configured to supply liquid. As in the first embodiment, the uncured portions of the first layer 2 and the second layer 3 are dissolved and the cured portion 2*a* of the first layer 2 is detached from the base substrate 1.

Thus, there can be provided a liquid ejection head including an ejection port-forming member 20 having a flow passage wall 21 configured to define a flow passage 11 of liquid that communicates with an ejection port (FIG. 5G).

Example

An example of a method for manufacturing a liquid ejection head according to the present invention will be described in Example. However, the present invention is not limited to Example.

Manufacturing of Mold

A specific method for manufacturing a mold of this Example will be described. In this Example, a mold 4 shown in FIG. 2B and including a projecting portion 4*a* corresponding to an ejection port, a projecting portion 4*b* corresponding to a flow passage, and a light-blocking film 5 corresponding to an ejection port was manufactured.

First, Al was formed on a quartz substrate by sputtering. A positive resist "OFPR-800" (trade name) available from TOKYO OHKA KOGYO CO., LTD was applied thereto.

Pattern exposure and development were performed using a mask having a pattern of an ejection port.

The Al film at an exposed portion was etched using mixed acid C-6 available from KANTO CHEMICAL CO., INC. and "OFPR-800" was removed to form a light-blocking film 5 corresponding to an ejection port.

"OFPR-800" was applied again to the quartz surface on which the light-blocking film 5 corresponding to an ejection port was formed. Pattern exposure and development were then performed using a mask having a pattern of a flow passage. The quartz substrate was processed by reactive ion etching (RIE) with a $CHF_3/CF_4/Ar$ gas using the patterned "OFPR-800" as a mask. A projecting portion 4*b* corresponding to a flow passage was formed by removing "OFPR-800".

Subsequently, the quartz substrate was processed by RIE with a $CHF_3/CF_4/Ar$ gas using the light-blocking film 5 corresponding to an ejection port as a mask to form a projecting portion 4*a* corresponding to an ejection port.

Thus, the mold 4 shown in FIG. 2B and including the projecting portion 4*a* corresponding to an ejection port, the projecting portion 4*b* corresponding to a flow passage, and the light-blocking film 5 corresponding to an ejection port was manufactured.

Manufacturing of Liquid Ejection Head

A specific method for manufacturing a liquid ejection head of this Example will be described with reference to FIGS. 2A to 2G.

First, 100 parts by mass of an organosiloxane resin composed of a copolymer of 4,4'-(1-methylethylidene)bis[2-(2-propenyl)phenol] and 1,3-dihydro-1,1,3,3-tetramethyldisiloxane and 10 parts by mass of hexamethoxymethylolmelamine were dissolved in 200 parts by mass of an ethyl lactate solvent. The resultant mixture was provided on a base substrate 1 made of Si by spin coating to form a first layer 2. The heating was then performed at 80° C. using a hot plate to volatize the solvent component. The thickness of the first layer 2 was 1 μm. Subsequently, "SU-83025" (trade name) available from Kayaku MicroChem Corporation that is a photo-cationic curable resin composition containing a photo-cationic initiator was provided on the first layer 2 by spin coating to form a second layer 3. The heating was then performed at 90° C. using a hot plate to volatize the solvent component. The thickness of the second layer 3 was 30 μm. Thus, a base substrate 1 shown in FIG. 2A on which the first layer 2 and the second layer 3 were stacked was obtained.

Next, the first layer 2 and the second layer 3 were imprinted using the manufactured mold 4. Specifically, after the base substrate 1 was heated to 100° C., the mold 4 was pressed against the first layer 2 and the second layer 3 shown in FIG. 2B at a pressure of 1 MPa as shown in FIG. 2C. The tip of the projecting portion 4*a* corresponding to an ejection port reached the first layer 2. By applying ultraviolet rays (dose: 350 $mJ/cm^2$) through the mold 4 as shown in FIG. 2D while the temperature of the base substrate 1 was held at 100° C., pattern exposure of an ejection port was performed on the second layer 3 using the light-blocking film 5 corresponding to an ejection port as a mask. The base substrate 1 was held at 100° C. for 4 minutes while the mold 4 was being pressed to perform post-exposure baking. This facilitated the curing of the second layer 3. Furthermore, a photo-cationic initiator contained in the second layer 3 and a cationic species produced by irradiation with ultraviolet rays diffused to part of the first layer 2. Since curing proceeds in the first layer 2 at a part into which the photo-cationic initiator and the cationic species diffused, a cured portion 2*a* of the first layer was formed.

As shown in FIG. 2E, the mold 4 was removed from the first layer 2 and the second layer 3.

As shown in FIG. 2F, the surface of a supporting substrate 7 including an energy generating element 8 was bonded to the surface of the second layer 3 on which a pattern was formed, by applying a pressure of 1 MPa to the supporting substrate 7 at 200° C. Before the bonding, the position of the energy generating element 8 was aligned with the position of an ejection port. Subsequently, the bonded body was immersed in a solution of methyl isobutyl ketone/xylene=⅔ to dissolve the uncured portions of the first layer 2 and the second layer 3. Thus, the base substrate 1 was removed from the cured portion 2*a* of the first layer 2 as shown in FIG. 2G. Through the steps described above, a liquid ejection head was manufactured.

The liquid ejection head of Example manufactured as described above was mounted on an apparatus and liquid ejection was performed. Liquid was smoothly ejected from the apparatus.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-323678 filed Dec. 19, 2008, which is hereby incorporated by reference herein in its entirety.

What is claimed is:

1. A method for manufacturing a liquid ejection head having an ejection port-forming member in which an ejection port configured to eject liquid is formed, comprising the steps of:

(a) preparing a substrate including:
 a base substrate;
 a first layer composed of a resin composition containing a compound that can be polymerized by irradiation with active energy rays under the presence of a polymerization initiator, and without a polymerization initiator, the first layer being formed on the base substrate; and
 a second layer composed of an active energy ray-curable resin composition containing the polymerization initiator, the second layer being formed on the first layer;

(b) pressing a mold, on which at least a pattern of the ejection port has been formed, against the first layer and the second layer;

(c) irradiating the second layer with the active energy rays through the mold or the base substrate using a mechanism that selectively blocks the active energy rays applied to a portion corresponding to the ejection port, the portion being disposed on the mold or the base substrate, while the mold is being pressed against the first layer and the second layer;

(d) performing post-exposure baking to cure the second layer irradiated with the active energy rays and to form a cured portion in the first layer at a part into which reaction sites of a polymerization reaction in the second layer have diffused, the rest of the first layer being left as an uncured portion;

(e) removing the mold;

(f) bonding the second layer to another supporting substrate; and (g) detaching the base substrate by dissolving the uncured portion of the first layer.

2. The method according to claim 1, wherein the mold is a mold having a mechanism that selectively blocks the active energy rays; and in the step (c), the second layer is irradiated with the active energy rays through the mold.

3. The method according to claim 2, wherein the base substrate is a substrate configured to block the active energy rays.

4. The method according to claim 1, wherein the base substrate is a base substrate having a mechanism that selectively blocks the active energy rays; and in the step (c), the second layer is irradiated with the active energy rays through the base substrate.

5. The method according to claim 4, wherein the mold is a mold configured to block the active energy rays.

6. The method according to claim 1, wherein a resin formed by curing the compound that is contained in the first layer and can be polymerized has repellency.

7. The method according to claim 1, wherein the step (g) of detaching the base substrate by dissolving the uncured portion of the first layer is performed before the step (f) of bonding the second layer to another supporting substrate.

8. The method according to claim 1, wherein the mold further includes a pattern for forming a flow passage of liquid that communicates with the ejection port and forms the flow passage of liquid in the ejection port-forming member at the same time.

9. A method for manufacturing a liquid ejection head having a flow passage-forming member configured to form a flow passage of liquid that communicates with an ejection port configured to eject liquid, comprising the steps of:

(a) preparing a substrate including:

a base substrate;

a first layer composed of a resin composition containing a compound that can be polymerized by irradiation with active energy rays under the presence of a polymerization initiator, and without a polymerization initiator, the first layer being formed on the base substrate; and a second layer composed of an active energy ray-curable resin composition containing the polymerization initiator, the second layer being formed on the first layer;

(b) pressing a mold, on which a pattern of the flow passage has been formed, against the second layer;

(c) irradiating the second layer with the active energy rays through the mold or the base substrate while the mold is being pressed against the second layer;

(d) performing post-exposure baking to cure the second layer and to form a cured portion in the first layer at a part into which reaction sites of a polymerization reaction in the second layer have diffused, the rest of the first layer being left as an uncured portion;

(e) removing the mold;

(f) bonding the second layer to another supporting substrate; and (g) detaching the base substrate from the cured portion of the first layer by dissolving the uncured portion of the first layer.

* * * * *